United States Patent
Bentley, II

[11] Patent Number: 5,878,891
[45] Date of Patent: Mar. 9, 1999

[54] RE-USABLE TRAY FOR ELECTRICAL COMPONENTS

[75] Inventor: Ralph Talmadge Bentley, II, Belews Creek, N.C.

[73] Assignee: The Whitaker Corporation, Wilmington, Del.

[21] Appl. No.: 936,481

[22] Filed: Sep. 18, 1997

[51] Int. Cl.$^6$ .................................................. B65D 73/00
[52] U.S. Cl. ......................................... 206/725; 206/557
[58] Field of Search ................................... 206/701, 718, 206/722, 723, 725, 521, 557, 561, 564

[56] References Cited

U.S. PATENT DOCUMENTS

| | | |
|---|---|---|
| 4,671,407 | 6/1987 | Brutosky . |
| 4,770,591 | 9/1988 | Wright et al. . |
| 4,842,137 | 6/1989 | Gallagher, Sr. . |
| 5,012,925 | 5/1991 | Gallagher, Sr. . |
| 5,246,328 | 9/1993 | Schuppert, Jr. et al. . |
| 5,285,559 | 2/1994 | Thompson et al. ...................... 206/723 |
| 5,360,109 | 11/1994 | Janota . |
| 5,474,178 | 12/1995 | Di Viesti et al. ....................... 206/723 |
| 5,524,766 | 6/1996 | Marchek et al. . |

Primary Examiner—Jacob K. Ackun
Attorney, Agent, or Firm—Bradley N. Ditty

[57] ABSTRACT

A transfer tray or tube assembly 2 is formed by an upper thermoformed sheet 4 that is bonded to a lower thermoformed sheet 6. Each sheet includes protrusions that form interior walls 10 and exterior walls 12 that in turn define channels 8 in which a number of components, such as electrical connectors, can be loaded, unloaded, stored and transferred or shipped. The thermoformed sheets 4 and 6 are bonding along adjoining dual wall sections that form the interior and exterior walls 10 and 12. Discrete bonds 34 are formed at upper and lower levels along flat abutting surfaces at the tops and bottoms of staggered trapezoidal segments 18 and 20 on the top and bottom sheets. These spaced apart discrete bonds 34 reduce warping and bowing due to stressed induced by RF bonds or welds. Interior walls 10 are joined by continuous bonds 36 that are confined to the intersection of a male ridge 42 on one member with a recessed female section 38 on the other member. Ribs 40 defining the recessed female section 38 isolated stresses induced by the bond so that the sidewalls of the channels 8 are not distorted. Multiple discrete bonds, spaced apart and on different levels, and dual walls each reduce distortion of the trays 2 and of the channels or tracks.

30 Claims, 7 Drawing Sheets

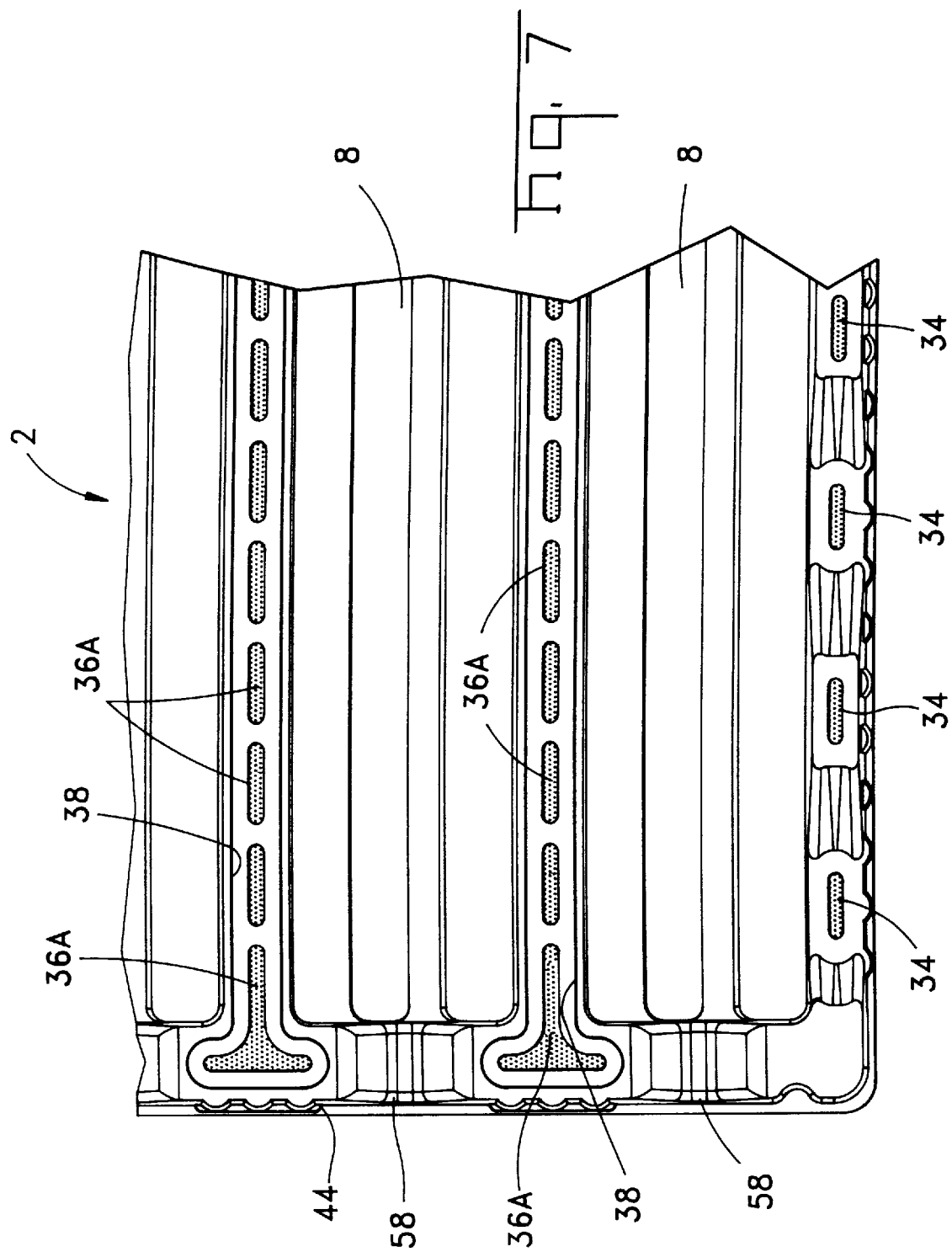

RE-USABLE TRAY FOR ELECTRICAL COMPONENTS

BACKGROUND OF THE INVENTION

1. Field of the Invention

This invention is related to the storage and transfer of components, such as electrical connectors, in transfer tubes, trays or containers and to the use of these containers with automated fabrication and assembly equipment.

2. Description of the Prior Art

Thermoformed tubes, trays or containers are commonly use to store and ship components and devices of different types including the storage and shipping of a large number of relatively small items in channels in a single tube, multi-tube assembly or tray. For example electrical components, such as electrical connectors, are commonly shipped in this manner. These types of containers provide a cost effective package that adequately protects these components or connectors during normal handling.

Most prior art tubes and trays of this type are disposable containers that are manufactured for the lowest possible cost. However, these containers are increasingly used as in-process packages in which various components are loaded and unloaded a number of times. For example, components packaged in these containers or trays may require several different manufacturing steps, such as molding and terminal insertion, that take place on different manufacturing lines and often at different manufacturing facilities. Testing and inspecting and other manufacturing steps must also be performed on the components. Finally the components must be shipped to a customer who in turn will assemble the components in a final or intermediate assembly. For example, it is common practice to use thermoformed tube assemblies of this type to feed electrical connectors to a manufacturing station in which the connectors are soldered to a printed circuit board.

A cost effective way of transporting or transferring these components or connectors between various manufacturing operations and to the customer is to use the same multi-tube assembly or tray and to repeatedly load and unload components and subcomponents in the same trays. If possible the tube assemblies or trays should then be re-used after the components have been unloaded for a final time. It is common for customers to ship empty containers back to the manufacture where the containers are repeatedly re-used as many times as possible.

For high volume assembly operations loading and unloading is typically performed by automatic equipment, such as robotic or pick and place equipment. Therefore the tubes or trays must be inherently robust and dimensionally stable. If the tubes or trays are susceptible to damage during use, proper alignment for loading or unloading becomes increasingly problematic. Furthermore if the single tubes or channels in multi-tube assemblies become distorted, the components may hang up in the channels resulting in incomplete loading and unloading.

Although robust construction is one consideration that is important to maintaining dimensional stability for re-usable in-process tube assemblies, fabrication considerations are also important. For example, the common way in which such tubes are fabricated is to bond two thermoformed members together. An RF welding process can be used to produce heat for bonding the thermoformed members. Although this produces a strong bond, the addition of heat also introduces stresses into the thermoformed plastic. One of the two sheets is heated more than the other during bonding, and the differential expansion induces stresses in the final product. These stresses can soon result in warping, bowing or other dimensional irregularities. The larger the tube assembly, and therefore the larger the number of components that can be stored, then the more these stresses will add up or accumulate to cause dimensional distortion that can affect the performance and reliability of these thermoformed packages U.S. Pat. No. 5,012,925 shows one package that is formed by a thermoformed top that is permanently bonded to an extruded member to form a multi-tube assembly. Similar prior art configurations in which thermoformed top and bottom members are permanently bonded are also used for in-process packaging. These prior art thermoformed packages, however, are derived from designs where the primary purpose was a disposable rather than a re-usable package. Therefore these prior art packages lack dimensional stability because of the stresses induced in bonding and the robustness that is needed for high volume in process use. Therefore excessive manufacturing problems are caused when the components are not properly loaded or unloaded. These problems will require intervention by the operator and often result in either discarding of components in partially filled packages or in manufacturing problems in final assembly. For example if an electrical connector is not properly fed from a tube to automatic assembly equipment, the connector may not be properly inserted into the final assembly, such as a printed circuit board. In either case increased manufacturing costs or reliability problems can ensue.

SUMMARY OF THE INVENTION

The present invention is a thermoformed container, tube assembly or tray that includes a plurality of channels between upper and lower thermoformed sheet members. These sheet members are permanently bonded, but the configuration of abutting thermoformed members is such that stresses induced by the bonding process are reduced or alleviated.

This invention employs multiple discrete bonds on multiple levels to alleviate stresses and limit distortion. One aspect of this invention employs a first series of abutting members bonded by discrete bonds that do not extend for the entire length of the container. Adjacent bonds are located on upper and lower levels above and below the center of the tray assembly. This increases space between bonds to reduce distortion. In the preferred embodiment staggered trapezoidal segments are formed on the top and bottom thermoformed sheet members. Flat truncated surfaces at the tops of the trapezoidal segments abut flat bases at the bottom of the trapezoidal segments and the discrete bonds are formed along these abutting flat surfaces.

Long continuous bonds can also formed along the length of abutting interior dual wall protrusions that abut to form interior walls. To further reduce stress, these long continuous bonds can be replaced by discrete bonds along the length of the container. In either case, one abutting wall protrusion has a recessed central section to form a female groove and the other abutting wall protrusion has a male ridge that fits within side ribs forming the opposed female recess. The continuous bond or the series of aligned discrete bonds are narrower than the ridge and stresses induced by the bonds do not therefore deform the walls defining the channels or tracks in which components are loaded. Any deformation that might occur is contained within the male portion of the molded form preventing product channel or track deformation.

A container or tray in accordance with this invention therefore overcomes many of the shortcomings of prior art thermoformed containers. Among the objects of this invention are the following.

The container or tray should not have internal stresses, induced at the time of fabrication, that will cause bowing, warping or other distortion of the tubes or trays in which the components are loaded. Furthermore, the tube assembly should be robust and not easily damaged. The containers should have sufficient dimensional stability to insure reliable loading and unloading of the components.

The tube assembly should also be suitable for in-process use in which the same tubes or containers are used for different manufacturing, fabrication, and assembly operations. These containers should also protect the component during shipping and storage.

These trays should also be suitable for repeated re-use, including use for new components after final unloading. These trays should also have a longer life than conventional thermoformed packaging trays or tubes.

These trays or multi-tube assemblies should also be suitable for transferring a relatively large number of components and should therefore be economically efficient to use and to manufacture. Secondary fabrication operations should be avoided to the extent possible.

These containers should also be suitable for use with automatic loading and unloading equipment, including robotic OR pick and place equipment and the trays should be easy to accurately move into proper alignment for loading and unloading. These trays should also be suitable for use with various types of unloading commonly used in manufacturing and assembly operations, including gravity feed, mechanical feed using rods to force the components out of the product tracks, or the use of air pressure or vacuum to feed the stored components. Adequate component lead in and simple means for retaining components in the tubes are also important.

The preferred embodiment of this invention achieves these and other objectives for packaging conventional electrical connectors and other embodiments in accordance with this invention can be used for other electrical and nonelectrical components.

BRIEF DESCRIPTION OF THE DRAWINGS

FIG. 7 is a view similar to FIG. 6 showing an alternate embodiment in which the long continuous bonds along internal walls are replaced by a series of discrete bonds.

DETAILED DESCRIPTION OF THE PREFERRED EMBODIMENT

Figure 1:
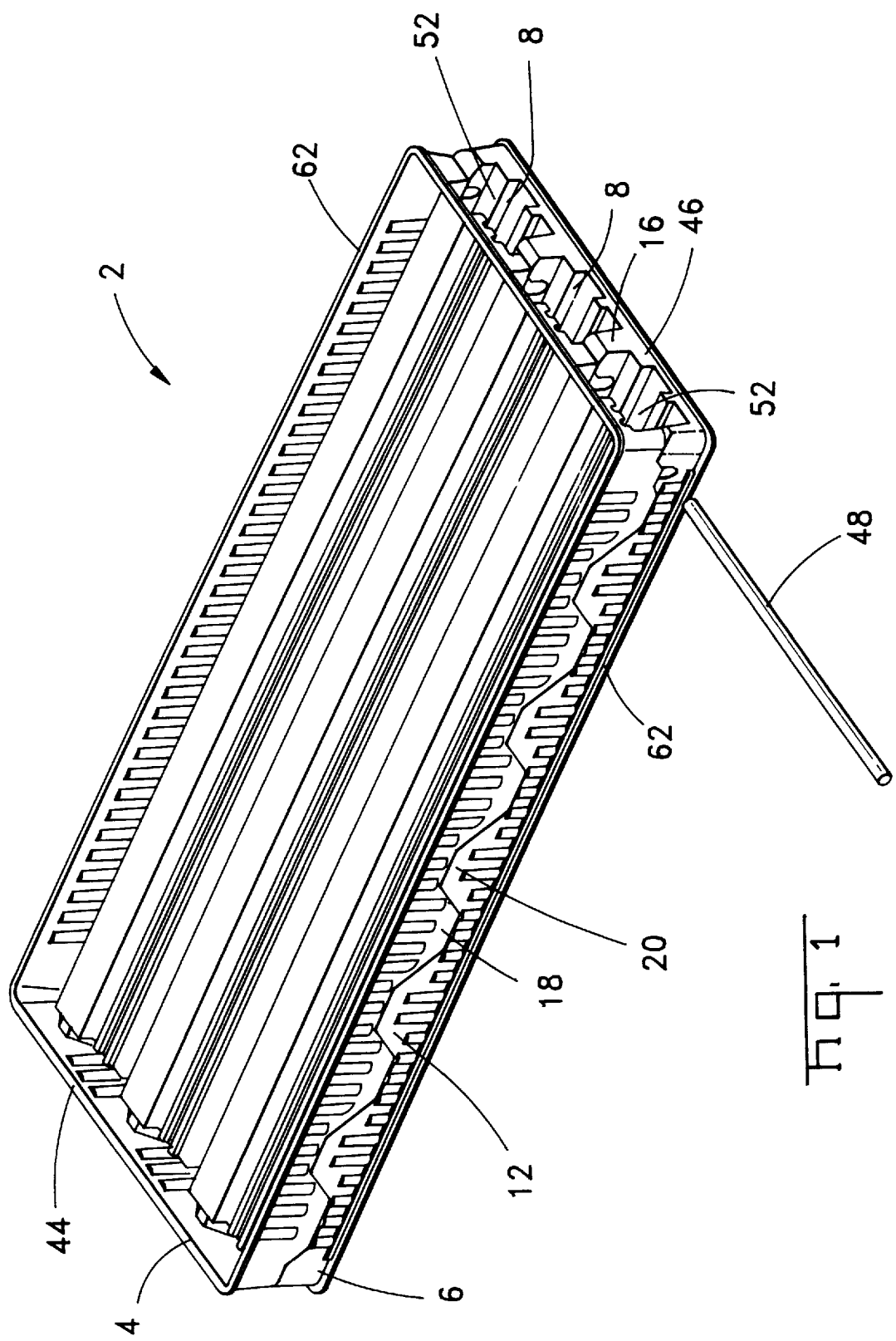
FIG. 1 is a view of a container in the form of a multi-tube tray or transfer tray in which electrical components, such as electrical connectors, can be loaded and unloaded from parallel channels or tracks.

The container 2 of the preferred embodiment of this invention comprises a transfer or storage tray that can be used with components, such as electrical connectors. This transfer tray 2 includes side by side channels or tracks 8 into which electrical connectors can be loaded and unloaded and shipped between various fabrication and assembly operations.

Transfer tray 2 is especially intended for repeated re-use. In addition to being an in-process transfer tray, this multitube tray is not discarded after an initial use, but is intended to be re-used. Electrical connectors can be loaded and unloaded from these multitube trays in a number of operations. Typically trays 2 would first receive molded connector housings from a typical multicavity molding operation. The housings are loaded serially into the channels. The loaded trays are then shipped to a second operation that would typically be located in a different manufacturing facility. At a terminal insertion facility, the molded connector housings would be unloaded from the trays 2 and terminals would then be inserted or stitched into the molded housings to complete fabrication of the connectors. The connectors would then be loaded back into trays 2 and the trays would be shipped in bulk in corrugated boxes or in process bulk bin containers to an assembly facility where the connectors would again be unloaded from the channels 8 in the trays 2. At this point the connectors would normally be incorporated into another assembly, such as a printed circuit board. Instead of disposing of the trays 2, the assembler would then ship the empty trays 2 back to the connector manufacturer for subsequent re-use. Typically the empty trays would be returned to the molder where new molded housings would be inserted into the tray channels 8 and these processes or steps would be repeated using the same trays.

Typically, each of the separate operations would use automatic loading and unloading equipment. The connectors and connector housings would be loaded or unloaded robotically or by pick and place equipment. In each case, the trays 2 must present the components in a specific location for automatic loading and unloading. Since the trays 2 are used repeatedly, each tray must be robust so that the trays do not become distorted by repeated handling. Furthermore, the trays 2 must be fabricated in such a way that they are not distorted by warping or bowing of the trays. In addition to the requirement that the connectors be loaded or unloaded at a precise position or station, the tray channels 8 must not be distorted in such a manner that the connectors will hang up in the channels 8 or that the individual channels will not be fully loaded. Problems of this type can cause an operator to dispose of an entire tray of relatively expensive components, or the particular component may be omitted from an expensive assembly. For example, electrical connectors may not be properly placed on printed circuit board assemblies. It is not always possible to increase the size of the channels 8 relative to the connector to assure proper loading or unloading because the connectors can be damaged during shipment. Therefore it is important that the cross section of the channel not be distorted, either by damage to the tray 2 or by warping or bowing during fabrication.

The multitube tray 2 is formed by a top thermoformed sheet member 4 that is bonded to a bottom thermoformed sheet member 6 by RF welds or bonds. Both the top member 4 and the bottom member 6 are separately thermoformed from initially flat sheet of polyvinyl chloride having an initial thickness of from approximately 0.018 to 0.040 inch.

A typical tray 2 measures approximately 21.25 inches by 8.50 inches by 2 inches.

Figure 2:
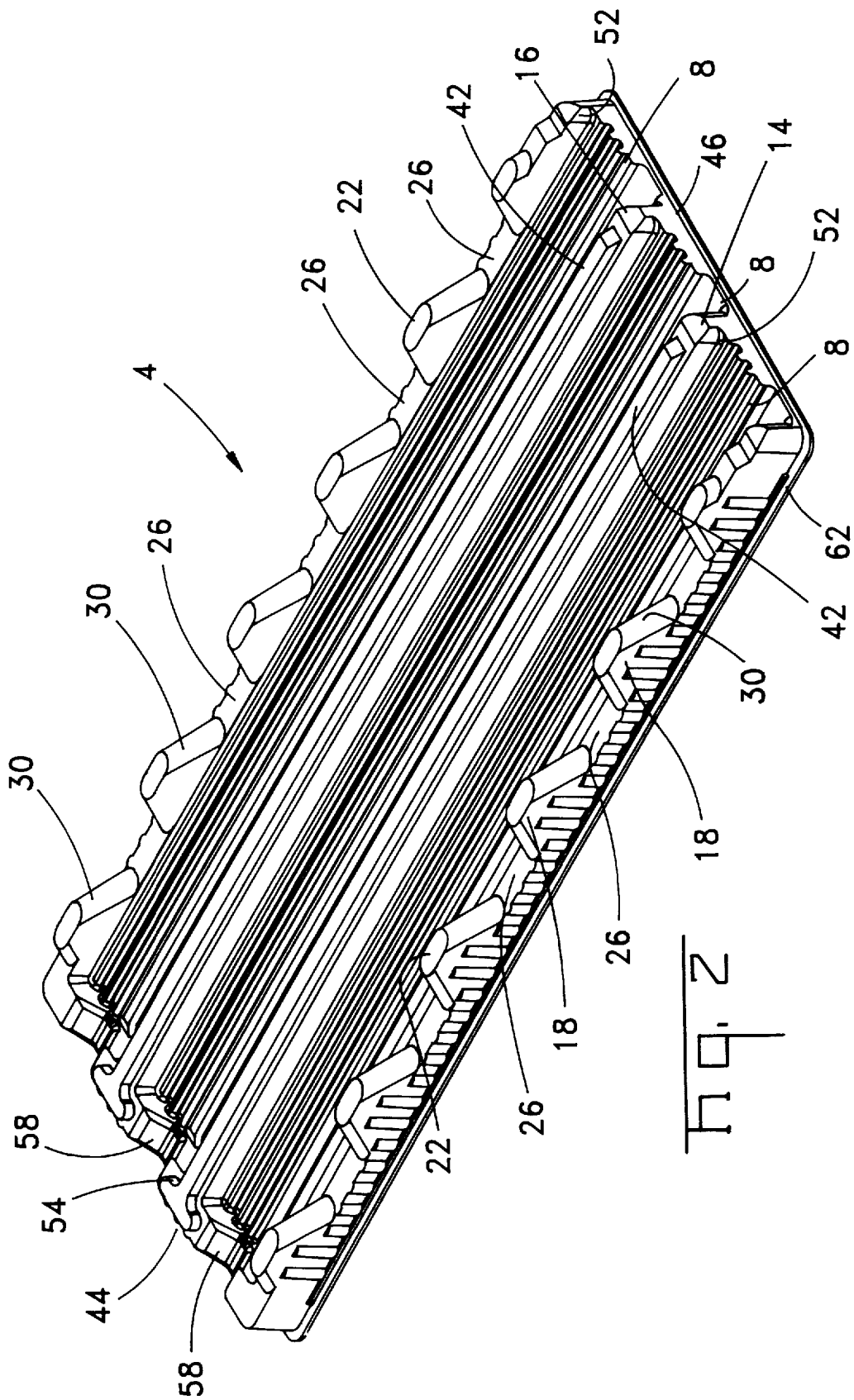
FIG. 2 is a view of the inner surface of a top thermoformed sheet member showing the internal channels in which electrical components can be positioned.
Figure 3:
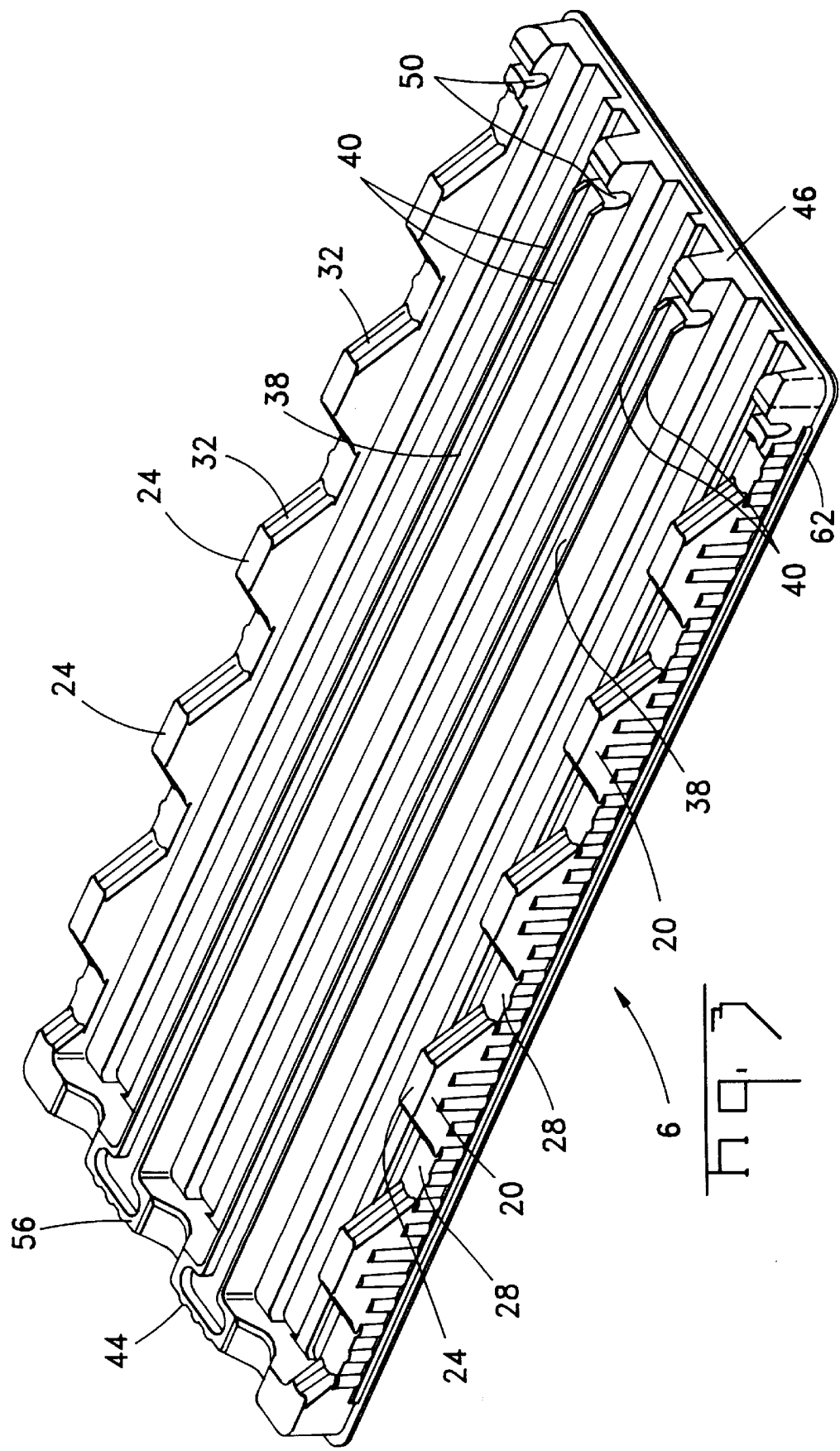
FIG. 3 is a view of the inner surface of a bottom thermoformed sheet member that is bonded to the top thermoformed sheet member to form the assembled tray or container.
Figure 4:
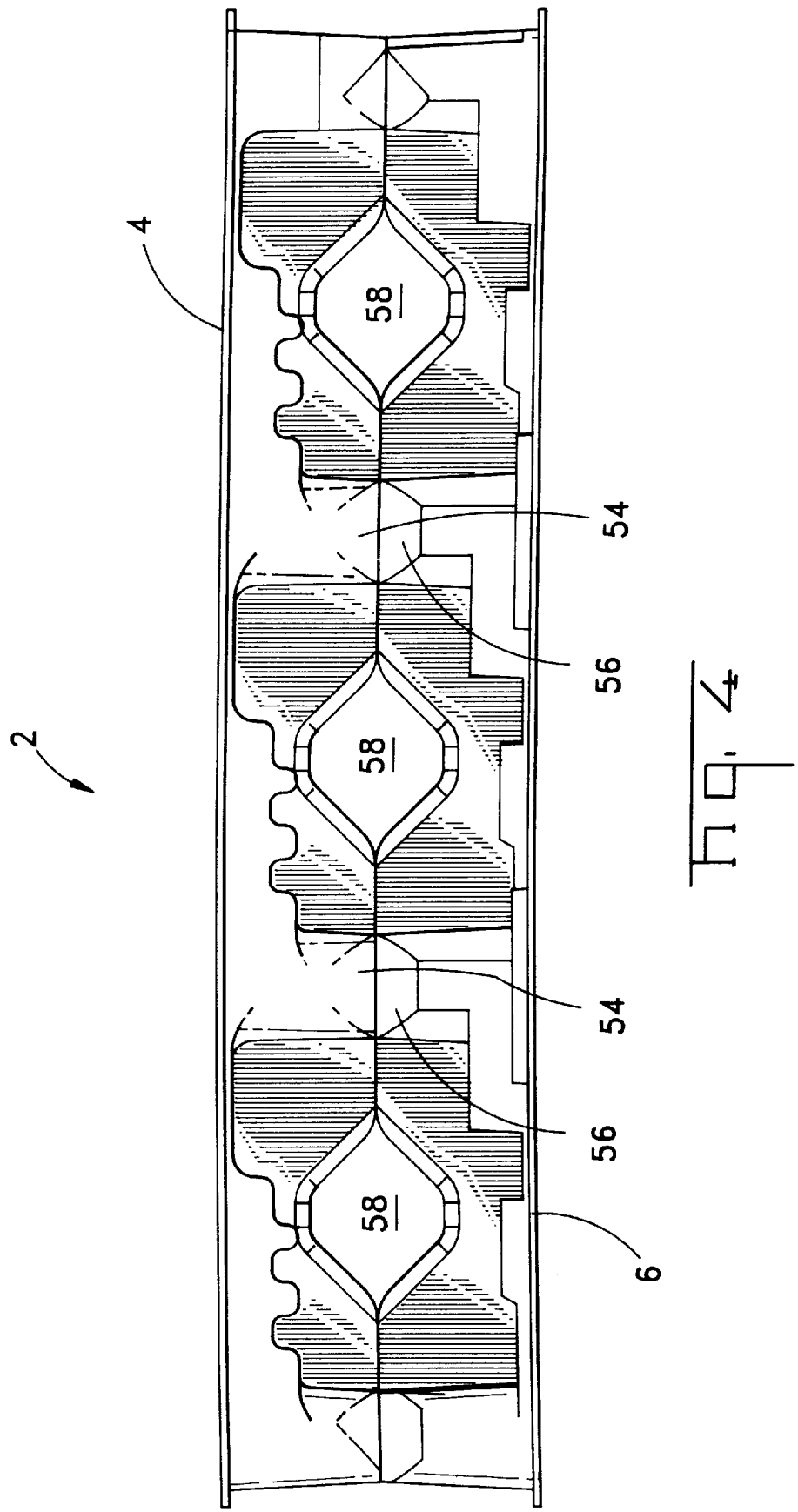
FIG. 4 is a view of the rear end of the tray showing the top and bottom members and openings to receive mechanical feed rods.
Figure 5:
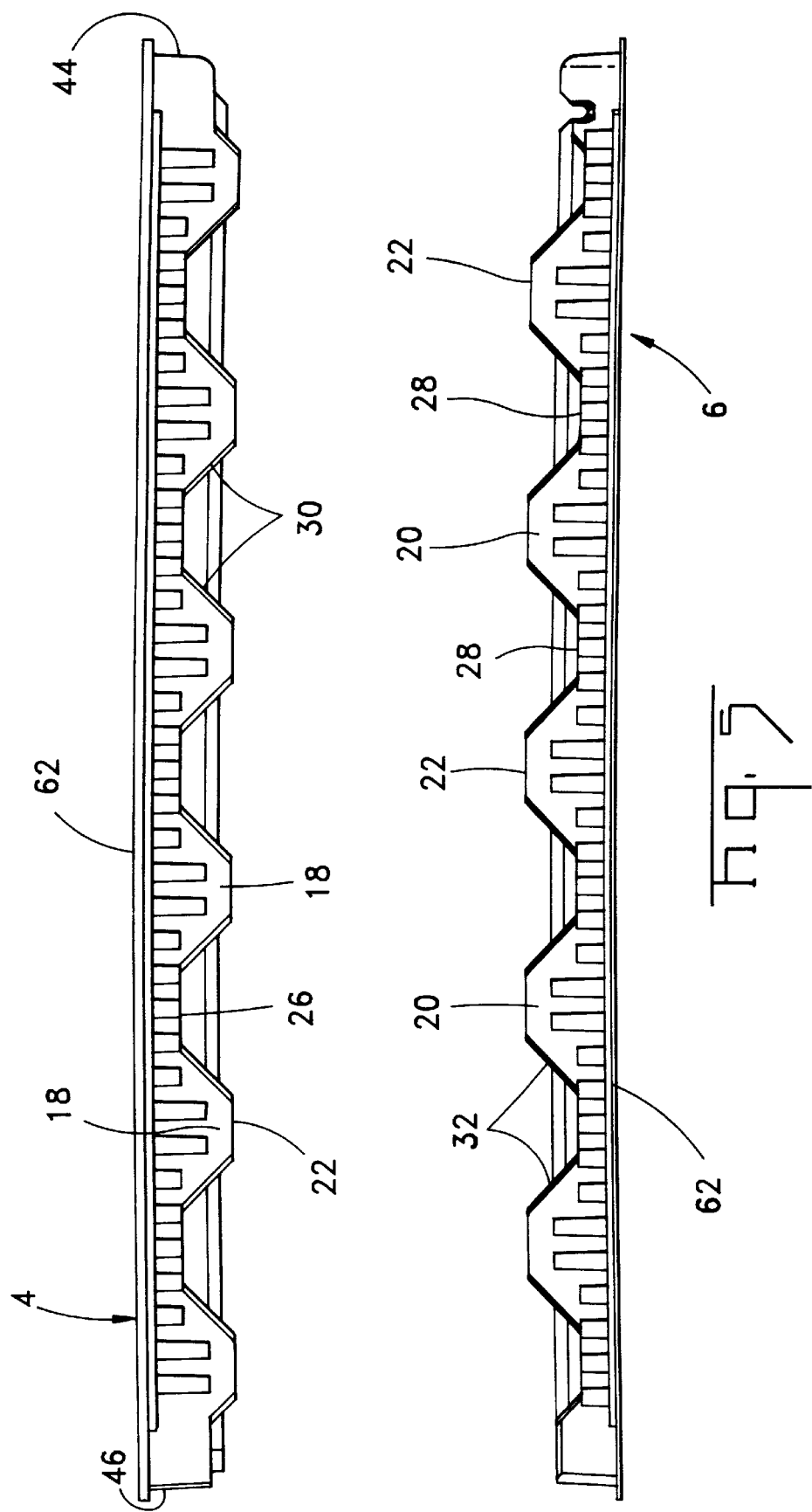
FIG. 5 is an exploded side view of the top and bottom members showing the trapezoidal protrusions that form the dual walled sides of the container.

The representative embodiment of the transfer tray 2 depicted herein has three channels extending substantially between opposite ends. The channels 8, which conform to the general shape of the component or electrical connector, are formed by multiple interior walls 10 and two exterior walls 12 that extend the length of the tray 2 and channels or tracks 8. Each of the interior walls 10 are formed by dual walled thermoformed protrusions 14 and 16 extending from the top and bottom sheet members 4 and 6 respectively. The exterior walls 12 are formed by dual walled thermoformed trapezoidal segments 18 and 20 extending respectively from the top sheet member 4 and the bottom sheet member 6. The interior wall protrusions 14 and 16 meet substantially along the centerline or central plane of the tray 2 to form the interior walls 10. The trapezoidal segments 18 and 20 are staggered and they meet opposed sections at upper and lower levels above and below the respective central plane. Trapezoidal segment 18 has a flat truncated top or outermost surface 22 on the top sheet 4, and trapezoidal segment 20 has a flat truncated top or outermost surface 24 on the bottom sheet 6. On the top sheet 4, adjacent trapezoidal segments 18 are separated by flat bases 26. Similarly on the bottom sheet 6, adjacent trapezoidal segments 20 are separated by flat bases 28. Opposing upper and lower trapezoidal segments 18 and 20 are however staggered so that when the top sheet 4 is brought into engagement with the bottom sheet 6, the top truncated surfaces 22 and 24 abut opposed bases 26 and 28 on the opposite sheet member. As shown in FIG. 2, the inclined side edges 30 of the top trapezoidal segments 18 are convex. The inclined side edges 32 of the bottom trapezoidal segments 20, shown in FIG. 3, are concave so that when opposed trapezoidal segments 18 and 20 are brought into engagement, the convex sides 30 are received within the concave sides 32 to center adjacent segments, to ensure a tight fit, and to insure a continuous unbroken wall without axial discontinuities.

If for some reason, the individual sheets are warped or do not meet dimensional specifications, the convex and concave surfaces will tend to urge the separate members into shape when these curved surfaces are brought into contact.

To join the top thermoformed sheet 4 to the bottom thermoformed sheet 6, discrete bonds 34 are formed between the flat truncated surfaces 22, 24 and the abutting flat bases 26, 28 on the opposite sheets. In the preferred embodiment, these discrete bonds 34 are RF bonds or welds in which RF energy locally heats and melts the area subjected to the RF energy so that a bond is formed when the plastic solidifies. In the preferred embodiment, these discrete bonds are substantially 0.750 inch by 0.100 inch. These discrete bonds 34 do not form a continuous bond or weld along the entire length of the tray and the vertical spacing of adjacent bonds on multiple levels between the top and bottom of the tray serves to further isolate these bonds. By spacing the discrete bonds 34 in this manner, any tendency of the surrounding plastic to bow or for distortion to result from the addition of energy in this manner is reduced or substantially eliminated. Distortion, bowing or warping can become a problem especially for a long bond running the length of the tray 2 or a series of closely spaced bonds. Bowing or warping in a tube results in variations of the cross section of the channels 8 in which the components are positioned in end to end relation. Spacing the discrete bonds in this manner also prevents bowing or warping of the sides of the tray 2 so that adjacent trays can be more precisely positioned when the trays are laterally fed during loading and unloading.

Figure 6:
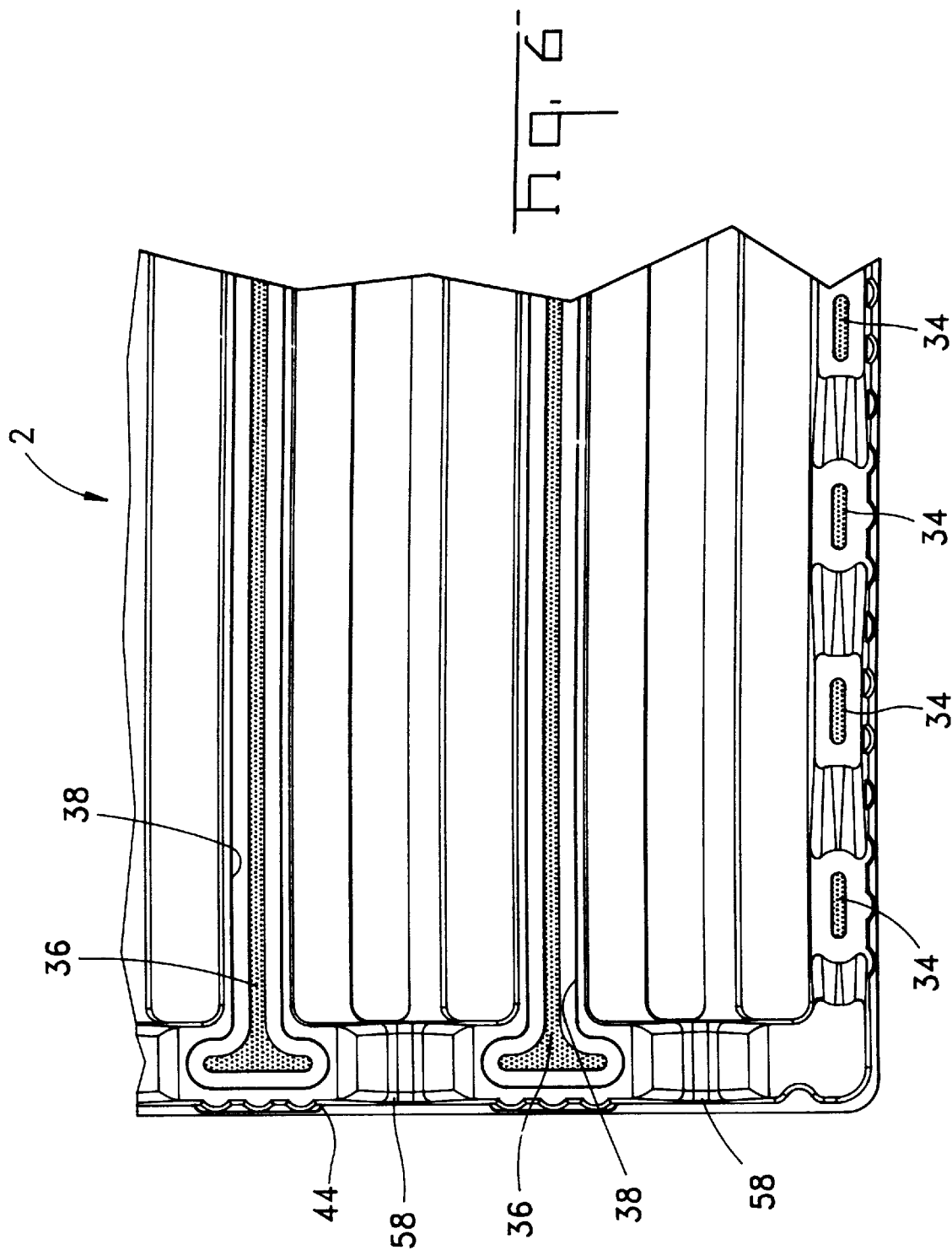
FIG. 6 is an enlarged view of a portion of the transfer tray showing the discrete and continuous bonds used to join the top and bottom thermoformed sheet members.

In the embodiment shown in FIG. 6, the interior walls 10 are joined by a single continuous bond 36 that extends substantially along the entire length of the tray 2. These continuous bonds 36 are also RF bonds or welds in the preferred embodiment of this invention. Continuous bonds 36 are formed where the outermost faces of the dual walled protrusions 14, 16 abut. As best seen in FIG. 3, this outermost face of the lower protrusions 16 on the bottom sheet 6 have a recessed central section 38 flanked by upstanding ribs 20 that extend along substantially the entire length of the protrusions 16. As best seen in FIG. 2, the upper protrusions 14 have a male ridge 42 that extends along substantially the entire length of the tray 2. The width of this male ridge 42 is slightly less than the width of the female recessed section 38 on the bottom sheet protrusions 16, and the height of the male ridge 42 is approximately the same as the depth of the female recessed section 38. Therefore the male ridge 42 is configured to fit within the female recessed section 38 with opposed faces abutting. When subjected to RF energy, a portion of the plastic along these opposed faces first melts and then resolidifies so the male ridge 42 is bonded to the female recessed sections 38 by the continuous bond or weld 36 that has a width less than the width of the male ridge 42. In the preferred embodiment, the width of this continuous bond is 0.100 inch. The dual walled ribs 40 are not bonded to the ridge 42 and any distortion, bowing or warping of either the male ridge 42 of the recessed bottom section 38 is minimized by the ribs. Vertical surfaces adjacent the bonds on both the ribs 40 and the ridge 42 do not form vertical sidewalls of the channels or tracks 8. This offset geometry along the abutting surfaces of the interior protrusions 14, 16 isolates any distortion to the central part of the interior walls 10 and limits the distortion of the sides of the interior walls 10 to maintain a dimensionally stable and substantially constant cross section for the channels 8. To further isolate stresses and further limit distortion, the long continuous bonds 36 can be broken into a series of discrete bonds 36A as shown in the alternate embodiment of FIG. 7. Both the continuous bonds 36 of FIG. 6 and the discrete bonds 36A of FIG. 7 are located in a plane that extends substantially along the middle of the tray 2, and these bonds are therefore located on a different level from the discrete bonds 34 located alternately in planes above and below the central plane of the tray 2.

With the top sheet 4 bonded to the bottom sheet 6, both ends of the tray 2 are at least partially open. The rear end 44 includes smaller push through openings 58 that provide space insertion of a rod to force the components or connectors out of the front end 46. Components or connectors are loaded and unloaded through the front end 46 The openings at the front end 46 is at least as large as the components or connectors positioned in the channels 8. Smoothly curved or tapered lead in sections 52 extending completely around the front of the channels 8 are also provided to provide a larger target for loading. These rounded lead in sections 52 are also less subject to damage or distortion than flat or cut edges.

To prevent the components or connectors from escaping from the channels 8 during shipping and handling a bar or cylindrical rod 48 is positioned across each channel. This bar fits within grooves 50 located in the lower wall protrusions forming both the interior walls 10 and exterior walls 12. These grooves 50 are formed during the thermoforming operation and no secondary cutting operations are necessary for form aligned holes or grooves through which the bar 48 is inserted. The ends of the bar 48 are also accessible from the sides so that they can either be pushed or pulled out when the components or connectors are to be extracted from the channels 8. Radiused lead ins can be formed on the grooves 50 on the interior walls 10 as well as on the exterior walls 12 so that the rod 48 can be easily inserted.

The rear end 44 is formed by top and bottom end wall protrusions 54 and 56 that meet along the centerline to form an end wall with hexagonal shaped push through openings 58 extending through the dual walled rear end. These openings 58 are aligned with the channels 8, but have a smaller cross section so that the components or connectors cannot enter or exit through the rear end 44. In the preferred embodiment a series of laterally extending discrete bonds are located between the upper and bottom rear end wall protrusions 54 and 56. These laterally extending bonds, having a T-shape at the rear end, stabilize both ends of the tray 2.

At least one exterior surface 60 of the interior walls 10 is a flat surface that provides a fixed reactions surface that can be engaged by automatic equipment to feed the trays laterally into position for automatic loading and unloading. Although the envelope dimensions of this tray 2 are more precise, because of the strength and lack of distortion that can be achieved, so that adjacent trays 2 can be more readily pushed into position by forces exerted on adjoining trays, some cases will require the increased accuracy that can be achieved by individually feeding the trays.

The more stable length and width of these trays 2 is further enhanced by forming a precisely cut rim or flange 62 extending completely around the top and bottom sheet members 4 and 6.

The representative embodiment depicted herein is the preferred embodiment of an in-process tube assembly or tray for loading, unloading, storing and shipping a standard printed circuit board electrical connector header containing right angle pins. Tube assemblies and trays of this type can however be used with other components or electrical connectors and are not limited to the specific configuration shown herein. For example, a tube assembly or tray of this type can be used with DIP components or sockets, surface mount electrical components, cable connectors and other electrical and non electrical components. Therefore the precise configuration and size of the channels will be dependent upon the component or device with which the tray is to be used.

Other equivalent modifications would also be apparent to one of ordinary skill in the art. For example, the trapezoidal segment could be replaced with other shapes, such as diamond, curved, elliptical, four sided or even generally rectangular segments that interfit with companion segments on the opposite sheet member. Similarly the precise shape of the male and female intersecting surfaces of the interior wall protrusions are not necessarily limited to the shape of the ridges and recessed walls and ribs of the preferred embodiment. Other shapes that provide an abutting surface along which a bond can be formed and which can be easily thermoformed could also be used.

Furthermore, this invention is not limited to assemblies in which the top and bottom sheet members are bonded or welded by RF welds. This invention could as easily be used when the bonds are formed by heat staking. Ultrasonic bonding will also induce stresses in the thermoformed members which would tend to result in distortion which can be alleviated by this invention. Therefore, the preferred embodiment is intended to be representative only and the invention is defined in terms of the following claims.

I claim:

1. A thermoformed component transfer container comprising a top member having bonding surfaces and a bottom member having bonding surfaces, the bottom member bonded to the top member to form at least one, channel in which discrete components can be positioned, said top member and bottom member extending on either side of a central plane, the top and bottom members being bonded by multiple bonds located between the bonding surface on at least two levels or planes other than said central plane to reduce distortion of the thermoformed container.

2. The container of claim 1 wherein adjacent discrete bonds are located on upper and lower levels.

3. The container of claim 1 wherein adjacent discrete bonds alternate between upper and lower levels.

4. The container of claim 1 wherein the discrete bonds are formed by heating the top and bottom members.

5. The container of claim 4 wherein the discrete bonds are RF bonds.

6. The container of claim 1 wherein the top and bottom members form dual sidewalls with discrete bonds being located between the dual sidewalls.

7. The container of claim 1 wherein the top and bottom members each include dual walled trapezoidal spaced apart segments along both sides, opposed trapezoidal segments on the top and bottom members fitting together to form dual sidewalls.

8. The container of claim 7 wherein each trapezoidal segment includes a flat truncated surface with adjacent segments being spaced apart by flat bases, opposed trapezoidal segments interfitting with opposed truncated surfaces on one member engaging opposed flat bases on the opposite member with the discrete bonds being formed between opposed truncated surfaces and flat bases.

9. The container of claim 7 wherein each trapezoidal segment has inclined side edges joining walls of the trapezoidal segment, side edges on one member having a concave surface and side edges on the other member having a convex surface so that convex surfaces on one trapezoidal segment interfits with a concave surface on an opposed trapezoidal segment.

10. The container of claim 1 wherein multiple channels are formed between sides of the container.

11. A transfer tray for use in loading and unloading electrical components from automated equipment, the tray comprising:

a top member and a bottom member;

multiple channels formed between the top and bottom members;

interior walls separating adjacent channels, each interior wall being formed by dual walled sections on the top member and the bottom member, the first dual section having a recessed central section flanked by side ribs, the other dual walled section having a ridge fitting within the side ribs on the first dual walled section, the top and bottom members being bonded between the side ribs and along a ridge so that the cross section of the channels is not distorted by bonding the top member to the bottom member.

12. The transfer tray of claim 11 wherein the top and bottom members are bonded by thermally formed bonds.

13. The transfer tray of claim 12 wherein the top and bottom members are bonded by RF bonds.

14. The transfer tray of claim 13 wherein at least one bond along the ridge of the second member extends continuously along substantially the entire length of the tray between opposite ends of the channels.

15. The transfer tray of claim 11 wherein the interior walls on the top and bottom members meet substantially along a central plane extending through the channels.

16. The transfer tray of claim 11 wherein a rear end of each channel is partially open to permit insertion of a push through rod to force the components out of a second end of the channel.

17. The transfer tray of claim 16 wherein the interior walls and exterior walls include grooves adjacent a front end for receiving a bar to prevent removal of the components when the bar is in place.

18. The transfer tray of claim 17 wherein the second end of each channel includes lead in sections extending completely around each channel to simplify insertion of electrical components into the channels.

19. The transfer tray of claim 11 wherein external sidewalls comprise interfitting sawtooth dual walled segments on both the top and bottom members with a plurality of discrete bonds being formed along each external sidewall.

20. The transfer tray of claim 11 wherein continuous bonds between opposite ends of the tray are spaced from the channels so that a constant channel cross section can be maintained by reducing distortion due to bonding the top member to the bottom member.

21. A re-usable container for use in loading and unloading electrical connectors in separate fabrication and assembly operations and for transport and storage of the electrical connectors between separate operations, the container comprising:

top and bottom thermoformed sheets;

interior walls formed on both the top and bottom sheets;

exterior walls formed on both the top and bottom sheets;

multiple side by side channels formed by abutting top and bottom interior and exterior walls;

the container being characterized in that the interior walls and the exterior walls are each formed by dual walled thermoformed protrusions in the top and bottom thermoformed sheets so that the thermoformed sheets can be bonded along abutting walls by bonds spaced from the channels to prevent distortion of the channels so that the cross sections of the channels remain substantially constant between opposite ends of the container.

22. The container of claim 21 wherein bonds formed between the top and bottom thermoformed sheets are thermally formed bonds.

23. The container of claim 22 wherein discrete bonds are formed along abutting exterior walls.

24. The container of claim 23 wherein bonds formed along abutting exterior walls are formed above and below a central plane of the channels.

25. The container of claim 22 wherein continuous bonds are formed between abutting interior walls.

26. The container of claim 22 wherein interior walls on one thermoformed sheet include a laterally recessed female section and the interior walls on the other thermoformed sheet include a laterally recessed male section with bonds joining abutting interior walls being formed along the laterally recessed male and female sections to prevent distortion of the cross section of the channels.

27. The container of claim 21 wherein dual walled protrusions form one end wall, the one end wall including openings for receiving a push through rod for pushing electrical connectors out through an opposite open end.

28. The container of claim 27 wherein grooves are formed along interior and exterior walls on the open end, the grooves receiving a bar to prevent removal of electrical connectors when the bar is in place.

29. The container of claim 28 wherein the channels include a tapered lead in extending completely around each channel.

30. The container of claim 21 wherein the outer surface of the top and bottom sheets include flat surfaces along the interior walls extending inwardly to form reaction surfaces permitting the container to be laterally indexed by automated equipment to precisely position individual channels for serially loading and unloading electrical connectors.

* * * * *